United States Patent
Meng

(10) Patent No.: US 10,054,629 B2
(45) Date of Patent: Aug. 21, 2018

(54) SYSTEMS AND METHODS FOR DETERMINING FUSE LOADS FOR FUSES HAVING MULTIPLE LOADS FROM MULTIPLE SUB-MODELS

(71) Applicant: Toyota Motor Engineering & Manufacturing North America, Inc., Erlanger, KY (US)

(72) Inventor: Ming Michael Meng, Novi, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 422 days.

(21) Appl. No.: 14/936,525

(22) Filed: Nov. 9, 2015

(65) Prior Publication Data
US 2017/0131342 A1    May 11, 2017

(51) Int. Cl.
G01R 25/00    (2006.01)
G01R 31/07    (2006.01)

(52) U.S. Cl.
CPC .................................. *G01R 31/07* (2013.01)

(58) Field of Classification Search
None
See application file for complete search history.

(56) References Cited

U.S. PATENT DOCUMENTS

| | | | |
|---|---|---|---|
| 5,604,892 A | 2/1997 | Nuttall et al. | |
| 5,646,862 A | 7/1997 | Jolliffe et al. | |
| 7,565,215 B2 | 7/2009 | Kolenc et al. | |
| 7,773,360 B2 | 8/2010 | O'Leary et al. | |
| 7,779,371 B2 | 8/2010 | Lottmann | |
| 8,261,230 B2 | 9/2012 | Huang et al. | |
| 8,649,987 B2 | 2/2014 | Steenberg et al. | |
| 8,686,596 B2 | 4/2014 | Huss et al. | |
| 8,760,170 B2 | 6/2014 | McDiarmid et al. | |
| 8,817,517 B2 | 8/2014 | Daigle | |
| 9,000,908 B2 | 4/2015 | Schnorr | |
| 9,026,409 B2 | 5/2015 | Schmidtke et al. | |
| 9,058,887 B2* | 6/2015 | Hsu .................. | G11C 17/18 |
| 2002/0032619 A1* | 3/2002 | Pozo .................. | G06Q 30/06 705/26.8 |
| 2006/0009959 A1 | 1/2006 | Fischer et al. | |

FOREIGN PATENT DOCUMENTS

EP    1705490    9/2006

* cited by examiner

*Primary Examiner* — Aditya Bhat
(74) *Attorney, Agent, or Firm* — Snell & Wilmer LLP

(57) ABSTRACT

A system can include a memory that can store a fuse load database including a list of fuses, a list of loads each designed to be coupled to at least one fuse from the list of fuses and a list of current values each corresponding to a load from the list of loads. The system can also include an input device configured to receive a selection of a fuse from the list of fuses. The system can also include a modeling processor coupled to the memory and the input device. The modeling processor can determine one or more loads from the list of loads that are designed to be coupled to the selected fuse. The modeling processor can also generate load summary data corresponding to a sum of the current values that correspond to the one or more loads.

20 Claims, 11 Drawing Sheets

FUSE LOAD SUMMARY - FUSE 200

| | LONG TERM LOAD (A) | SHORT TERM LOAD (A) | MAX LOAD (A) |
|---|---|---|---|
| TOTAL FUSE LOAD | 4 | 4 | 5.5 |
| FUSE LOAD PERCENTAGE | 80% | 80% | 110% |

FIG. 6A

| TYPE | SIZED (A) | PWR LINE | TERM ID | TERM TYPE | NO. | LOAD | LONG TERM LOAD (A) | LONG TERM LOAD (V) | SHORT TERM LOAD (A) | SHORT TERM LOAD (V) | MAX LOAD (A) | MAX LOAD (V) |
|---|---|---|---|---|---|---|---|---|---|---|---|---|
| LOW MINI | 5 | ACC | | | | | | | | | | |
| | | | 206 | 040III | 1 | ECU 208 PIN 216 | 1.5 | 12 | 1.5 | 12 | 2 | 12 |
| | | | 302 | 040III | 2 | SPEAKER 310 | 1 | 12 | 1 | 12 | 1.5 | 12 |
| | | | | | 3 | LIGHT 312 | 0.5 | 12 | 0.5 | 12 | 0.5 | 12 |
| | | | | | 4 | WIPERS 314 | 1 | 12 | 1 | 12 | 1.5 | 12 |
| | | | | | | TOTAL FUSE LOAD | 4 | | 4 | | 5.5 | |
| | | | | | | FUSE LOAD PERCENT | 80% | | 80% | | 110% | |

FIG. 6B

SYSTEMS AND METHODS FOR DETERMINING FUSE LOADS FOR FUSES HAVING MULTIPLE LOADS FROM MULTIPLE SUB-MODELS

BACKGROUND

Field

The present invention relates to systems and methods for identifying loads on fuses of vehicles using a model of the vehicle and, more particularly, for identifying individual and total loads on fuses that are connected to multiple loads from multiple sub-models of the vehicle.

Description of the Related Art

Vehicle engineers and designers ("users") are increasingly utilizing technological advances to incorporate new capabilities and features into vehicles. For example, electronic control units (ECUs) can control many functions of a vehicle from ignition of engine cylinders and control of transmissions to control of vehicle telematics and infotainment systems. The increase in the use of technology results in more complicated electronic and power systems designs for vehicles. For example, vehicle electronic systems designed 30 years ago may have only included one or two ECUs whereas vehicle electronic systems designed today may include 50 or more ECUs. As the number of electronic devices used in vehicles increases, the complexity of designing power systems to provide power to the electronic devices also increases.

Power systems of vehicles typically include fuses for protecting the electronic components from power surges. As vehicles include more and more electronics, more fuses are typically required to provide adequate protection against power surges. However, there is a desire to keep the quantity of fuses in any vehicle to a minimum due to costs and ease of replacement. More specifically, each additional fuse used in a vehicle has a monetary cost. Because some vehicle designers and manufacturers can sell hundreds of thousands of vehicles within a particular line, each additional fuse included in a vehicle design can cost the manufacturer millions of dollars. Furthermore, complexity of identifying the location of a blown fuse can increase as the number of fuses in a vehicle fuse box increases.

Users typically design a model of a vehicle electronic system using modeling software prior to manufacturing the system. The model can be used for designing and testing various sub-systems of the vehicle electronic system. Because of the complexity of vehicle electronic systems, the model may include various sub-models each including a portion of the entire model.

However, including sub-models presents difficulty in tracing all connection points of a component, such as a fuse, especially if the fuse has a first load within a first sub-model and a second load within a second sub-model. When modifying a model of vehicle electronic systems, a user may desire to modify or add loads to one or more fuses.

Prior to computer-implemented models, users would draw a schematic on a large sheet of paper by hand. In order to determine which loads were connected to any given fuse, the user could simply trace the connections to the fuse. However, when a fuse in a computer-implemented model is connected to loads in two or more sub-models, a user cannot simply trace the connections to the fuse.

Thus, there is a need in the art for methods and systems that can determine the total and individual loads applied to each fuse used in a vehicle model.

SUMMARY

The present invention relates to systems and methods for determining whether total current that can flow through fuses is at or below a predetermined current limit that is based on a current rating of the fuses. A system can include a memory configured to store a fuse load database including a list of fuses, a list of loads each designed to be coupled to at least one fuse from the list of fuses and a list of current values each corresponding to a load from the list of loads. The system can also include an input device configured to receive a selection of a fuse from the list of fuses. The system can also include a modeling processor coupled to the memory and the input device. The modeling processor can determine one or more loads from the list of loads that are designed to be coupled to the selected fuse. The modeling processor can also generate load summary data corresponding to a sum of the current values that correspond to the one or more loads.

A method for determining whether total current that can flow through fuses is at or below a predetermined current limit that is based on a current rating of the fuses. For example, the method can include storing, in a memory, a fuse load database including a list of fuses, a list of loads each designed to be coupled to at least one fuse from the list of fuses and a list of current values each corresponding to a load from the list of loads. The method can also include receiving, via an input device, a selection of a fuse from the list of fuses. The method can also include determining, by a modeling processor, one or more loads from the list of loads that are designed to be coupled to the selected fuse. The method can also include generating, by the modeling processor, load summary data corresponding to a sum of the current values that correspond to the one or more loads.

A method for determining whether total current that can flow through fuses is at or below a predetermined current limit that is based on a current rating of the fuses. For example, the method can include storing, in a memory, a fuse load database including a list of fuses, a list of loads each designed to be coupled to at least one fuse from the list of fuses and a list of current values each corresponding to a load from the list of loads. The method can also include displaying, by a display, a sub-model diagram including a selectable fuse from the list of fuses and one or more loads from the list of loads that are designed to be coupled to the selectable fuse. The method can also include receiving, via an input device, input data corresponding to a selection of the selectable fuse. The method can also include comparing, by a modeling processor, the selectable fuse to the list of fuses to determine a match. The method can also include generating, by the modeling processor, load summary data corresponding to a sum of the current values that correspond to the one or more loads that are designed to be coupled to the selectable fuse. The method can also include displaying, by the display, the load summary data.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention, wherein:

FIG. 6A is a drawing illustrating fuse load summary data corresponding to a fuse of the model of FIG. 1A according to an aspect of the present invention;

FIG. 6B is a drawing illustrating fuse detail data corresponding to the fuse of FIG. 6A according to an aspect of the present invention;

DETAILED DESCRIPTION

Figure 1A:
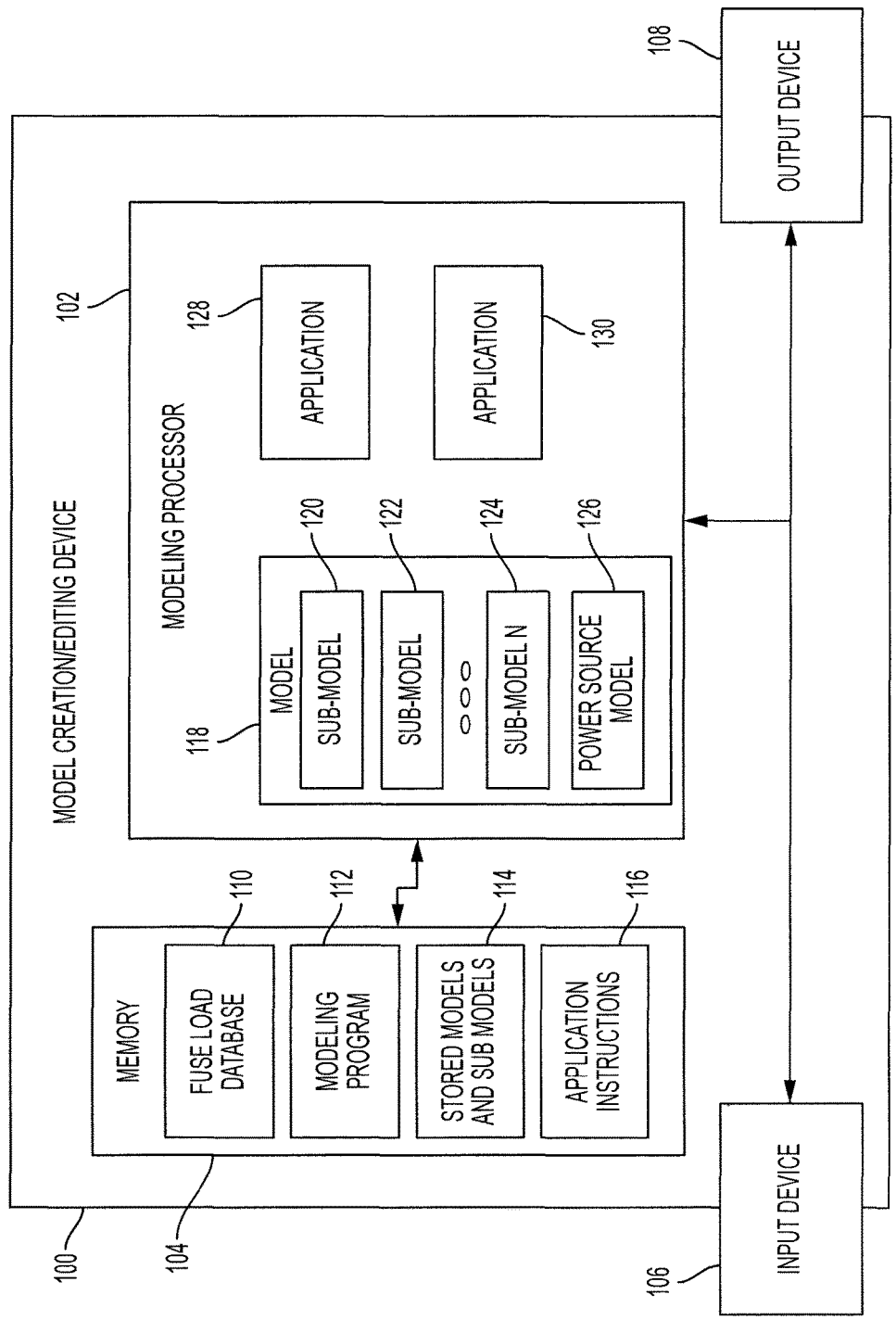
FIG. 1A is a block diagram illustrating components of a modelling device used for creating and/or modifying a model of a vehicle electronic system according to an aspect of the present invention.

Disclosed herein are systems and methods for determining whether a total current designed to flow through a fuse of a vehicle is within an acceptable range of current values. This is determined using one or more models of the vehicle. The systems and methods provide several benefits and advantages such as allowing an engineer, designer or other user ("user") to review summary data associated with the loads of each fuse, such as total current designed to be drawn from any fuse. Allowing a review of this total current provides benefits and advantages such as reducing the likelihood of errors being made during design of vehicle electronic systems and expediting the design process for these electronic systems. The systems and methods provide further benefits and advantages such as allowing the user to review details regarding each load, such as a description of the load, a terminal to which the load is to be connected and various current values associated with the load. The systems and methods provide further benefits and advantages such as allowing a user to quickly toggle between a sub-system diagram including the fuse and at least one load, the summary data associated with the loads and any details regarding each load. This provides benefits and advantages such as allowing a user to more quickly review and/or make modifications to the electronic system.

An exemplary system can include an input device for receiving data from a user and an output device for outputting data. The system can also include a memory for storing data. For example, the memory can store modeling software for modeling electronic systems of vehicles and can store models of vehicle electronic systems, including any sub-models within models. The memory can also store a fuse load database that includes all of the fuses used in a particular model along with information corresponding to loads connected to the fuses. The system can also include a modeling processor. The modeling processor can run the modeling program to instantiate a model stored within the memory. The modeling processor can also run an application for searching the fuse load database along with another application for creating and modifying the fuse load database. The applications may be included within the modeling program or may be separate from the modeling program. When a user is working with a model within the modeling program, a user can select a fuse within the model. The modeling processor, by running the searching application, can access the fuse load database and retrieve all load information corresponding to the selected fuse. The display can then display the load information in summary or detail format.

Referring now to FIG. 1, a model creation/editing device (or modeling device) 100 includes a modeling processor 102, a memory 104, an input device 106 and an output device 108. The memory 104, the input device 106 and the output device 108 can each be coupled to the modeling processor 102.

The input device 106 may be any input device capable of receiving input. For example, the input device 106 can include a mouse, a button, a keyboard, a touchscreen and/or another input device. The modeling processor 102 can receive input signals corresponding to any input received by the input device 106.

The output device 108 may include any output device capable of outputting data. For example, the output device 108 can include a display, a speaker, a touchscreen and/or another output device. The modeling processor 102 can transmit data to the output device 108 and the output device 108 can then output the data.

The modeling processor 102 may include one or more modeling processors and be capable of implementing logic. The modeling processor 102 can be a general purpose processor, a digital signal processor (DSP), an application specific integrated circuit (ASIC), a field programmable gate array (FPGA) or other programmable logic device, discrete gate or transistor logic, discrete hardware components, or any combination thereof. The modeling processor 102 may include an internal memory (for example, a cache) and/or may be coupled to the memory 104.

The memory 104 can include one or more non-transitory memories capable of storing data. In some embodiments, the memory 104 may or may not be separate from the modeling processor 102. The memory 104 may store instructions that can be executed by the modeling processor 102 and/or may store any additional data such as databases, other data received from the modeling processor 102 or the like.

The memory 104 and the modeling processor 102 may be used together to create and edit models of electronic systems of vehicles. For example, the memory 104 may include a modeling program 112 designed to be executed by the modeling processor 102. When the modeling processor 102 executes the modeling program 112, a user can input data using the input device 106 to create and/or edit a model 118.

Vehicle electronic systems can include many components, including speakers, lights, electronic control units (ECUs) or the like that receive and use power from a power source. The functionality and specifications of each component of a system can be represented in the model 118. Because the number of components is relatively large, it is not efficient to create/edit the entire model 118 at one time. Thus, the model 118 includes multiple sub-models. For example, the model 118 can include a first sub-model 120, a second sub-model 122 and any number of additional sub-models 123. Each of the sub-models can include representations of one or more electronic component of the system. Typically, one sub-model can be displayed using the output device 108 at any given time, however some embodiments exist in which more than one sub-model can be displayed simultaneously. The model 118 can also include one or more power source sub-model(s) 126. Each power source sub-model 126 can include a representation of a power source along with representations of cables or wires that connect the power source to various components of the model.

When components herein are described with reference to the model or the sub-model, the components are logical representations of components and only represent the physical devices. Thus, when logical representations of components are coupled within a model, they are not yet physical coupled and instead are designed to be coupled. However, for ease of description herein, a logical representation of a component may be referred to as a component and a component that is designed to be coupled to another component may be referred to as a component coupled to another component.

When working with a model, a user may desire to add a new component. The component (i.e., a "power load" or a "load") may have a certain power requirement and it may be preferable for the load to be protected by a fuse. It may also be preferable to connect the load to an existing fuse rather than to add a new fuse to the model. The process of adding a new load to a fuse can be more efficient if the user can determine the total and individual load currents already connected to the fuse.

Figure 1B:
FIG. 1B is a drawing illustrating a fuse load database including a list of fuses in the model of FIG. 1A along with corresponding loads according to an aspect of the present invention.

Referring now to FIG. 1B, the fuse load database 110 includes a list of all fuses used within the model 118 and all loads that are attached to each fuse. The fuse load database 110 also includes additional information. For example, the fuse load database 110 includes an identifier of each fuse, a type of each fuse and a size of each fuse (i.e., a current rating of the fuse). The fuse load database 110 also includes an identifier of a power line to which each fuse is connected. The fuse load database 110 also includes an identifier of each terminal to which each fuse is connected. The fuse load database 110 further includes a count of each load that is coupled to each fuse. For each load, the fuse load database can include an identifier of the load (which may be descriptive of the load), power information associated with the load and a drivability ranking associated with the load.

The power information for each load can include various current and/or voltage values. For example, the fuse load database 110 can include a long-term current and a long-term voltage for each load. The long-term current/voltage corresponds to the current/voltage that each load draws/receives from the fuse in a steady state. The fuse load database 110 can also include a short-term current and a short-term voltage. Due to components that affect signal phase, such as inductors and capacitors, the current flowing through any particular load may be different from a steady-state current draw when a system is initializing or shutting down. The short-term current/voltage corresponds to the current/voltage that each load draws/receives during system startup and/or system shutdown. The fuse load database 110 can also include a maximum current and a maximum voltage for each load. The maximum current/voltage corresponds to a maximum current/voltage that may be drawn/received by a particular load. Stated differently, the maximum current/voltage corresponds to the current/voltage rating of the load.

The drivability ranking corresponds to an amount of drivability that can be affected by the particular load if the particular fuse coupled to the load fails. Based on the fuse load database 110, the speaker 310 has a drivability ranking of 6 that corresponds to a low effect on drivability. For example, when a speaker of a vehicle can no longer receive power and thus cannot operate properly, a user can still operate the vehicle in substantially the same manner as when the speaker is functioning properly. Further based on the fuse load database 110, the wipers 314 have a drivability rating of 2 that corresponds to a high effect on drivability. For example, when wipers of a vehicle can no longer receive power and thus cannot operate properly, a user cannot operate the vehicle as well in the rain as when the wipers are functioning properly. Thus, the wipers 314 have a drivability ranking of 2 that corresponds to a much higher effect on drivability than the drivability ranking of 6 of the speaker 310.

The fuse load database 110 shown in FIG. 1B is exemplary only and one skilled in the art will realize that a fuse load database can have any organization, layout and/or look and can include all, some or none of the information shown in FIG. 1B. For example, a fuse load database can include only current values and exclude voltage values, can only include long-term load values or the like.

Returning reference to FIG. 1A, the memory 104 can store application instructions 116 corresponding to one or more application usable to determine fuse load information. For example, a first application 128 can be executed by the modeling processor 102 and used to determine load information corresponding to any fuse selected by a user. A second application 130 can be executed by the modeling processor 102 and used to create and/or update the fuse load database 110. In some embodiments, one or more application can be incorporated into the modeling program 112 (i.e., can be included with the modeling program 112) and/or can be separate from the modeling program 112. Functionality of the first application 128 and the second application 130 will be described with more detail below.

Figure 2:
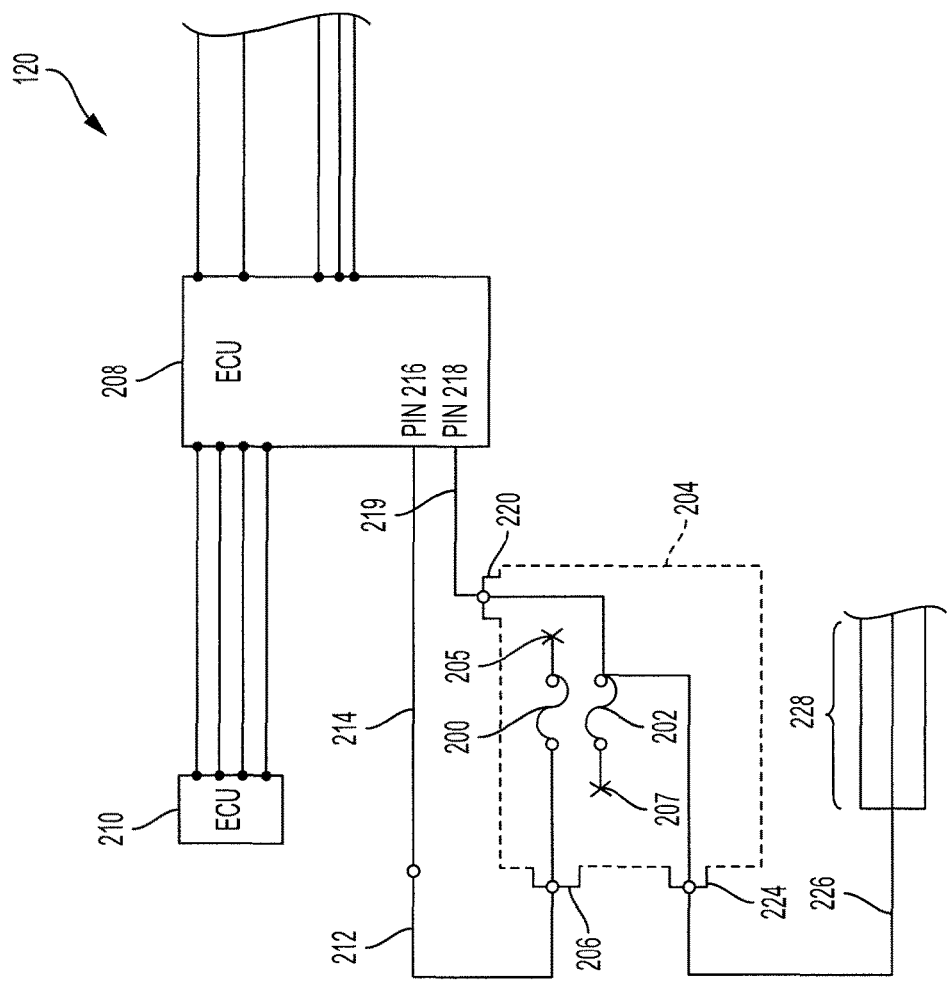
FIG. 2 is a drawing illustrating a sub-model of the vehicle of FIG. 1A according to an aspect of the present invention.

Turning to FIG. 2, the first sub-model 120 includes an ECU 208 and an ECU 210. The first sub-model 120 also includes a fuse housing 204 containing a fuse 200 and a fuse 202. The fuse 200 is coupled to a node 205 and receives power from the node 205. The fuse 200 is also coupled to a terminal 206 of the fuse housing 204. A first wire or cable ("cable") 212 is connected to the terminal 206 and receives the power from the node 205 via the fuse 200 and the terminal 206. A second cable 214 connects the first cable 212 to the ECU 208. More particularly, the second cable 214 connects the first cable 212 to a pin 216 of the ECU 208. Thus, power from the node 205 can flow through the fuse 200, the terminal 206, the first cable 212 and the second cable 214 to the pin 216 of the ECU 208.

The fuse 202 receives power from a node 207 and is connected to a terminal 220 of the fuse housing 204. The terminal 220 is connected to a pin 218 of the ECU 208 via a cable 219. The fuse 202 is also connected to a terminal 224 of the fuse housing 204. A cable 226 receives power from the terminal 224 where it is divided into three power lines 228 and distributed to additional components (not shown).

Figure 3:
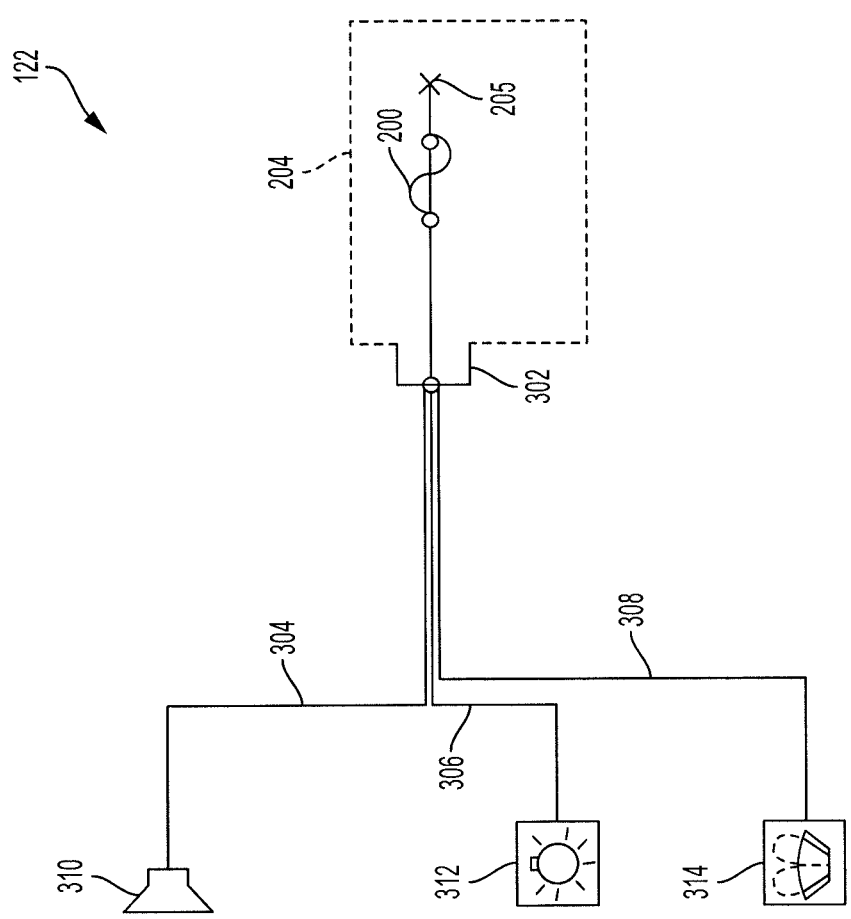
FIG. 3 is a drawing illustrating another sub-model of the vehicle of FIG. 1A according to an aspect of the present invention.

Turning now to FIG. 3, components of the second sub-model 122 are shown. The second sub-model 122 includes the fuse housing 204 and the fuse 200 that receives power from the node 205. The fuse 200 is connected to a terminal 302 of the fuse housing 204. The terminal 302 may be connected to a speaker 310, a front light 312 (such as a headlamp) and a windshield wiper 314 via a first cable 304, a second cable 306 and a third cable 308, respectively.

Figure 4:
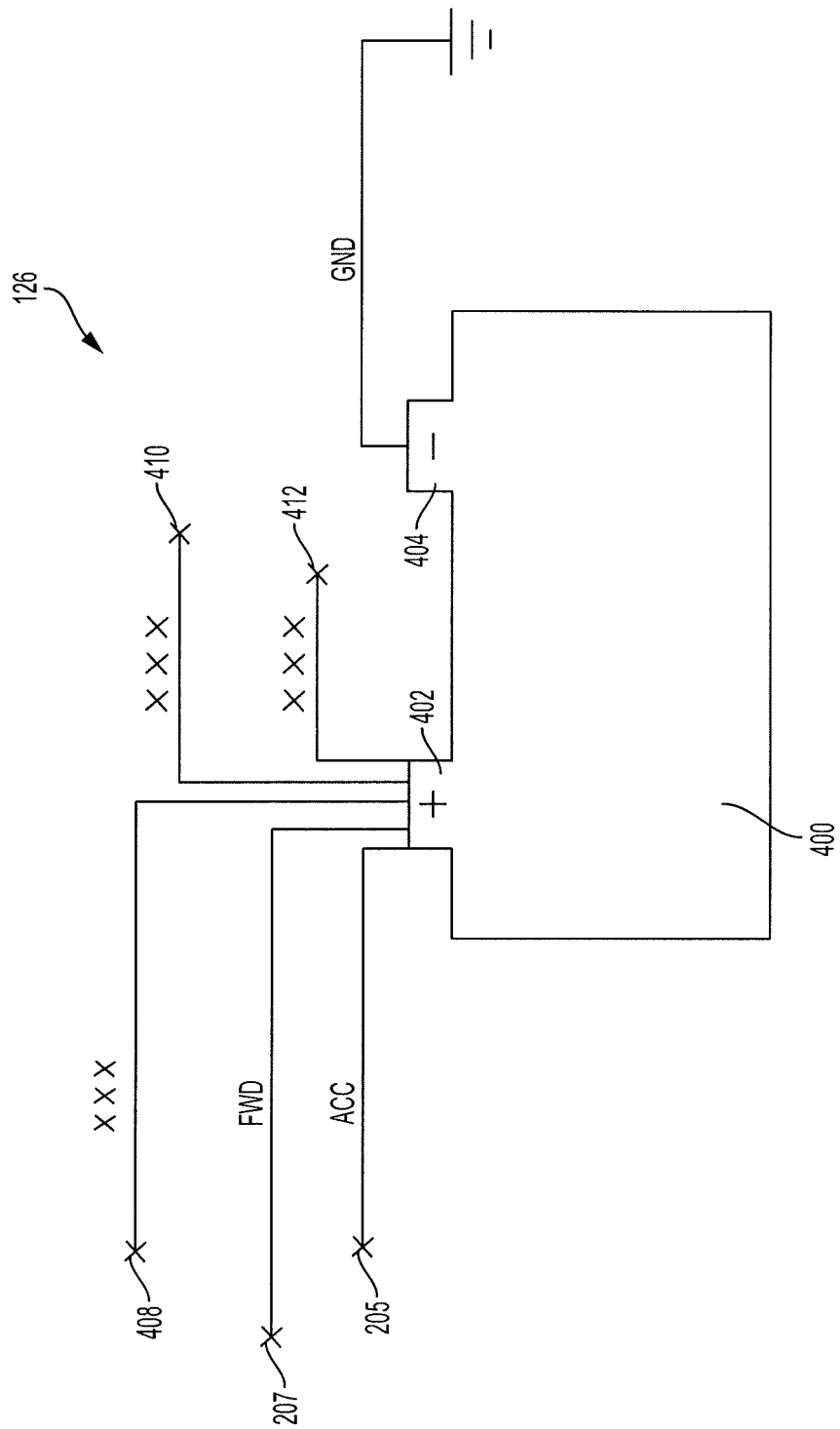
FIG. 4 is a drawing illustrating a power sub-model of the vehicle of FIG. 1A according to an aspect of the present invention.

Turning to FIG. 4, components of the power source sub-model 126 are shown. The power source sub-model 126 includes a battery 400 having a positive terminal 402 and a negative terminal 404. The negative terminal 404 is connected to ground. The positive terminal 402 is connected to a number of cables that each lead to a separate node. As shown, the positive terminal 402 is connected to the node 205 via an ACC power line, to the node 207 via a FWD power line and the nodes 408, 410, 412 via other power lines. In some embodiments, some or all of the power lines can receive power from additional and/or alternative components such as, for example, an alternator.

Referring to FIGS. 1A, 1B, 2, 3 and 4, the fuse 200 is connected to components of the first sub-model 120 and components of the second sub-model 122 and receives power from components of the power source sub-model 126. More particularly, the fuse 200 receives power from the positive terminal 402 of the battery 400 via the node 205. The fuse 200 is also connected to the pin 216 of the ECU 208 of the first sub-model 120 and to the speaker 310, the front light 312 and the windshield wiper 314 of the second sub-model 122. When reviewing the model 118 of FIG. 1A to determine the loads and/or power sources coupled to each fuse, a user cannot simply look at a sub-model displayed on the output device 108. However, this information is stored within the fuse load database 110 and can be accessed, such as by the first application 128 of FIG. 1, to determine any information regarding the loads and/or power sources corresponding to any given fuse.

Figure 5A:
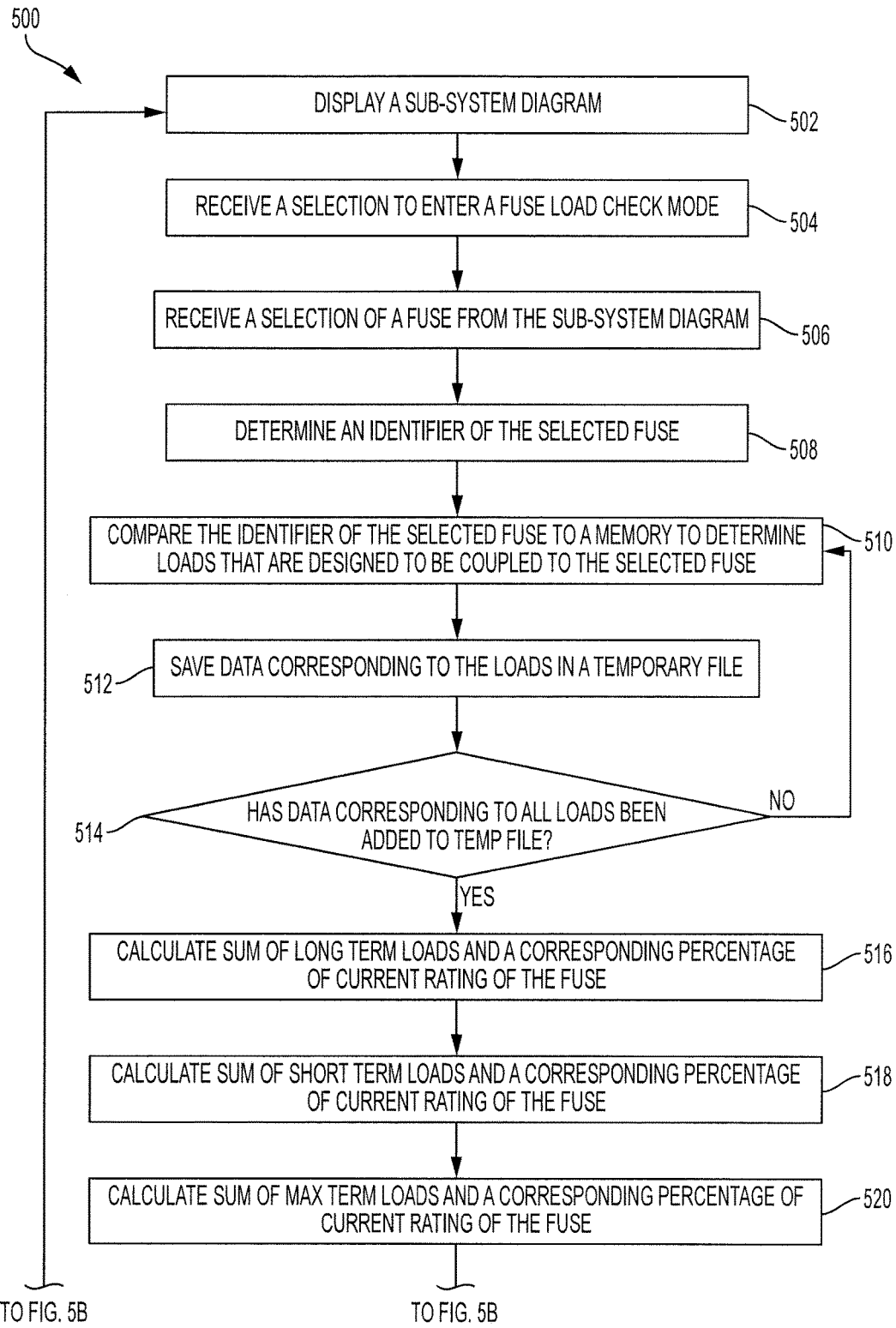
FIGS. 5A and 5B show a flowchart illustrating a method for determining load data corresponding to a fuse of a vehicle electronic model according to an aspect of the present invention.
Figure 5B:
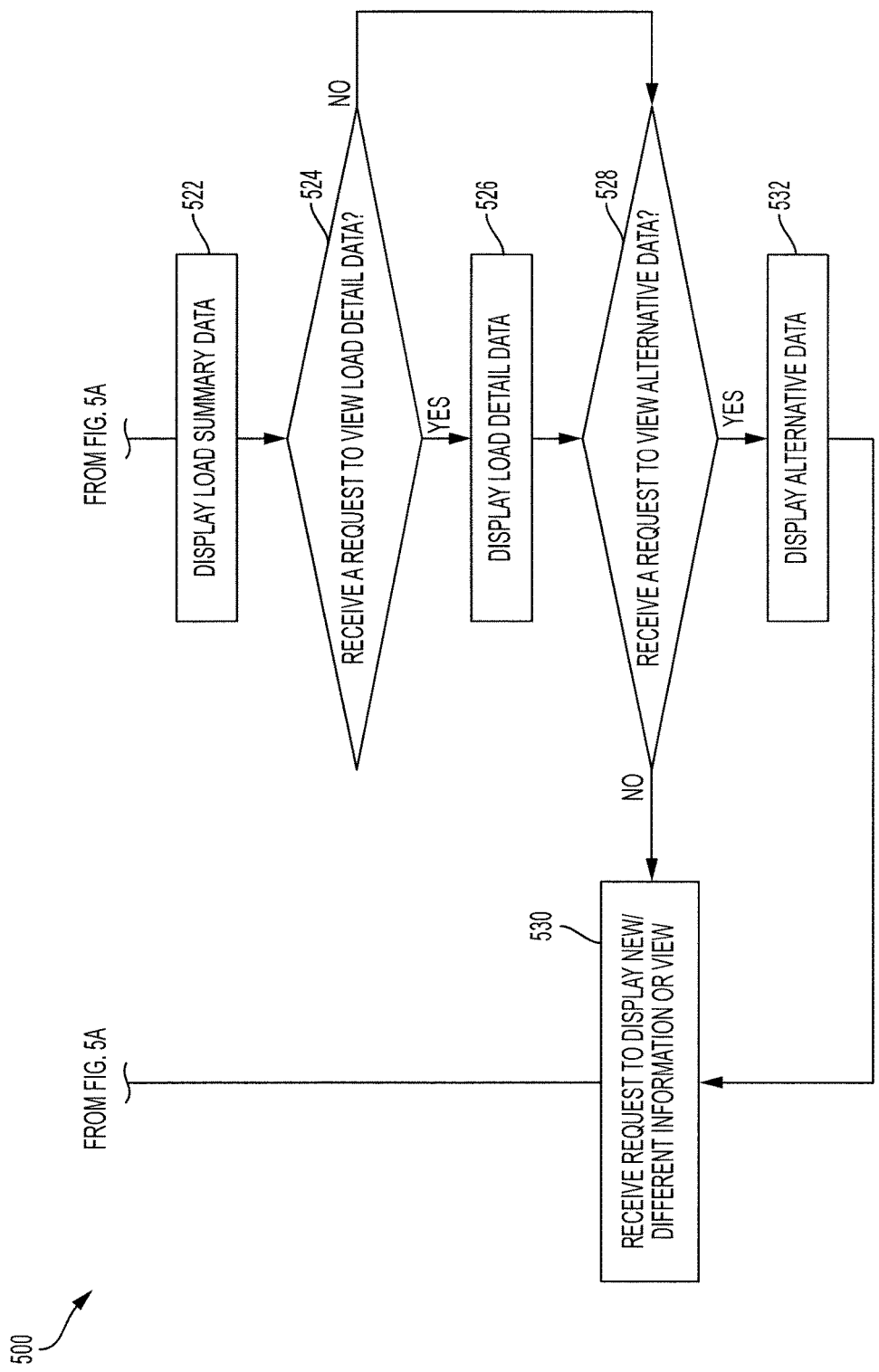

Turning to FIGS. 1A, 5A and 5B, a method 500 for utilizing the fuse load database 110 to determine fuse load information is shown. The method 500 may be performed by a modeling device such as the modeling device 100. The method 500 or adaptations of it can be executed on any modeling device and remain within the scope of the disclosure.

Beginning at block 502, a sub-model diagram corresponding to a sub-model of a model may be shown on a display. For example, the first sub-model 120 of the model 118 may be output by the output device 108 (such as via a display). The sub-model may have an appearance that is similar to the first sub-model 120 as shown in FIG. 2 and/or may be displayed in any other format.

The modeling processor 102 can receive a request, via the input device 106, to enter a fuse load check mode at block 504. For example, a user may make the request within the modeling program 112 using the input device 106, such as by clicking a button on a menu bar (not shown).

At block 506, the modeling processor 102 can receive a selection of a fuse from the sub-model diagram. The selection of the fuse can be received via the input device 106 and can be made by any method. For example and referring to FIGS. 1A and 2, a user may use the input device 106, such as a mouse, to hover over the fuse 200 and then "click" on the fuse 200. This "click" may correspond to a selection of the fuse 200. Additionally or alternatively, a user can use a keyboard to enter an identifier of the desired fuse and/or can select the desired fuse from a list of fuses.

The modeling processor 102 can determine an identifier of the selected fuse at block 508. The modeling processor 102 may do so, for example, by retrieving data corresponding to the selected fuse from the model 118 and/or any sub-models. For example, upon receiving the selection of the fuse 200, the modeling processor 102 can determine that the identifier of the selected fuse is the fuse 200.

Returning reference to FIGS. 1A, 5A and 5B, at block 510, the modeling processor 102 may compare the determined identifier of the selected fuse to the fuse load database 110 to determine any loads that are coupled to the selected fuse. With brief reference to FIGS. 1A and 1B, the modeling processor 102 can compare the identifier of the fuse, such as the fuse 200, to the fuse load database 110. The modeling processor 102 can then determine that the four loads listed in the fuse load database 110 correspond to the fuse 200.

Returning to FIGS. 1A, 5A and 5B, the modeling processor 102 can save any load data corresponding to the selected fuse at block 512. For example, the modeling processor 102 can save the data in a cache of the modeling processor 102 and/or in the memory 104. The data may be stored in a temporary file within the memory 104, and/or may be saved in a currently-existing file, such as within the modeling program 112.

At block 514, the modeling processor 102 may determine whether all load information corresponding to the selected fuse has been stored in the temporary file or another file. If all of the load information has not yet been stored, the method 500 may return to block 510 to continue searching the fuse load database 110 for additional load information corresponding to the selected fuse.

At block 516, the modeling processor 102 may calculate the sum of the long-term currents drawn by the loads that are coupled to the selected fuse. For example, the modeling processor 102 can add together the long-term current for each load connected to the selected fuse that is stored in the temporary file.

At block 518, the modeling processor 102 may calculate the sum of the short-term currents drawn by the loads that are coupled to the selected fuse. For example, the modeling processor 102 can add together the short-term current for each load connected to the selected fuse that is stored in the temporary file.

At block 520, the modeling processor 102 may calculate the sum of the maximum currents drawn by the loads that are coupled to the selected fuse. For example, the modeling processor 102 can add together the maximum current for each load connected to the selected fuse that is stored in the temporary file.

At block 522, the modeling processor 102 may output, using the output device 108, load summary data including a sum of all currents drawn from the selected fuse. With reference to FIG. 6A, the load summary data 600 corresponding to the fuse 200 is shown. The load summary data 600 may appear in a similar format as shown in FIG. 6A and/or may be shown in any other format. The load summary data 600 can include the total long-term current drawn from the fuse 200, the total short-term current drawn from the fuse 200 and the maximum current drawn from the fuse 200.

It may be desirable for each of the total current values drawn from a fuse (long-term, short-term and maximum) to stay below a predetermined percentage value corresponding to a percentage of the current capacity of the fuse 200. This may be especially true for the long-term current. If the long-term current drawn from a fuse is near the current capacity of the fuse, then the fuse may burn out (or blow) relatively quickly, which may be undesirable. Thus, users may wish to prevent the total long-term current drawn from a fuse from reaching or exceeding the predetermined percentage value. For example, the predetermined percentage value may be seventy percent (70%), may be eighty percent (80%), or may be any other percentage value. In some embodiments, the predetermined percentage value may be the same for the long-term current, the short-term current and the maximum current. In some embodiments, the predetermined percentage may be different for one or more of the long-term current, the short-term current or the maximum current. For example, the predetermined percentage may be seventy percent (70%) for the long-term current and for the short-term current, and may be eighty-five percent (85%) for the maximum current.

In order to provide information regarding whether additional loads can be connected to a particular fuse and/or how much additional current can be drawn from the fuse, the load summary data 600 includes a percentage of current drawn from the fuse compared to the current capacity of the fuse (fuse load percentage). As shown, the fuse load percentage of the long-term current and the short-term current for the fuse 200 are each approximately eighty percent (80%), while the fuse load percentage of the maximum load is approximately one hundred and ten percent (110%). If the predetermined percentage value is seventy percent (70%) for long-term and short-term currents, the fuse 200 may have too many loads connected to it (stated differently, the fuse 200 may have too much current being drawn from it). However, if the predetermined percentage value is eighty percent (80%), the long-term current values and the short-term current values associated with the fuse 200 may be acceptable, although it may be desirable to prevent connecting additional loads to the fuse 200.

The maximum current fuse load percentage is one hundred and ten percent (110%). Any fuse load percentage at one hundred percent (100%) or above the fuse's capacity is undesirable as that amount of current may cause the fuse 200 to rapidly degrade. Thus, the maximum current that can currently be drawn from the fuse 200 may be unacceptably high. Accordingly, it may be desirable to remove at least one load from the fuse 200.

Referring now to FIGS. 1A, 2, 3 and 6A, the first application 128, or another application of the modeling processor 102, may generate alerts when the total current from the loads connected to a fuse is greater than the predetermined percentage value. For example, a user may first connect the pin 216 of the ECU 208, the speaker 310 and the front light 312 to the fuse 200. The user may then connect the windshield wiper 314 to the fuse 200. The addition of the windshield wiper 314 may cause the maximum fuse load percentage of the fuse 200 to become greater than the predetermined percentage value. In response, the modeling processor 102 may alert, via the output device 108, the user that the maximum fuse load percentage of the fuse 200 is above the predetermined percentage value. The modeling processor 102 may then request that the user review the loads connected to the fuse 200. The warning may be audible, visible or any other type of warning. For example, a notification window may "pop up" on a display and/or a "beep" or other sound may be generated from a speaker.

It may be desirable for each fuse of a model to be coupled to loads that each has the same drivability ranking. This ensures that a load having a low effect on drivability does not affect a load having a high effect on drivability. For example and referring to FIGS. 1A, 1B, 2 and 3, if the speaker 310 blows the fuse 200, this would prevent the ECU 208 pin 216, the front light 312 and the windshield wipers 314 from receiving power and, thus, being operational. This is an undesirable result as the drivability of the vehicle can become greatly reduced if the ECU 208 pin 216, the front light 312 and the windshield wipers 314 become unoperational. Thus, it would be desirable to disconnect the speaker 310 from the fuse 200 to reduce the likelihood of this result.

In some embodiments, it may be desirable for each load having a drivability ranking below a certain level (such as a drivability ranking of 3) to be connected to its own fuse. For example and in some embodiments, it may be desirable to connect the ECU 208 pin 216 alone to a first fuse, the front light 312 alone to a second fuse and the wipers 314 alone to a third fuse. This increases the likelihood that each load capable of affecting drivability (i.e., the ability to safely drive the vehicle with all major components working) above a certain predefined amount will not be affected by the other loads. This advantageously allows the designer to have the more important vehicle components be connected to their own fuse, thus reducing the likelihood that multiple major vehicle components are disabled or unoperational at the same time should a single fuse blow. This ultimately improves and enhances the vehicle safety and design.

Regardless of whether it is desirable for each fuse to be coupled to loads corresponding to a single drivability rating and/or for each load having a drivability ranking below a certain level to be connected to a single fuse, the first application 128, or another application of the modeling processor 102, may generate alerts based on drivability rankings. In some embodiments, the modeling processor 102 can compare the drivability rankings of all loads connected to a fuse. When a load is improperly or should not be coupled or connected to a fuse based on the drivability ranking, the modeling processor 102 may generate an alert. For example, the ECU 208 pin 216, the front light 312 and the windshield wipers 314 may initially be coupled to the fuse 200. When the speaker 310 is later coupled to the fuse 200, the modeling processor 102 may compare the drivability ranking of the speaker 310 to the drivability ranking of the ECU 208 pin 216, the front light 312 and the windshield wipers 314 and determine that the speaker 310 is improperly or should not be connected to the fuse 200. In response, the modeling processor 102 may alert the user, via the output device 108, that the speaker is improperly or should not be connected to the fuse 200 based on the drivability ranking. The modeling processor 102 may then request that the user review the loads connected to the fuse 200. The warning may be audible, visible or any other type of warning. For example, a notification window may "pop up" on a display and/or a "beep" or other sound may be generated from a speaker. The modeling processor 102 may then prompt the user to select another fuse to connect the speaker to.

Returning now to FIGS. 1A, 5A and 5B, the modeling processor 102 may receive a request to view load detail data at block 524. The request may be received from the input device 106, such as in response to a user clicking on a button indicating a request to open the load detail data. The load detail data includes similar information as the load summary data 600 shown in FIG. 6A and may include more or less information. In response to receiving the request to view the load detail data, the modeling processor 102 may, via the output device 108, cause the load detail data to be output at block 526.

Referring to FIG. 6B, the load detail data 650 corresponding to the fuse 200 is shown. The load detail data can have a similar format as the load detail data 650 and/or may have any different format. For example, the load detail data 650 can include the information included in the load summary data 600 of FIG. 6A along with additional details. The information provided in the load detail data 650 may be retrieved by the modeling processor 102 from the fuse load database 110.

The load detail data 650 may include the same or similar information regarding the fuse 200 as is stored in the fuse load database 110. For example, the load detail data 650 can include the type of fuse, the size of the fuse and the power line from which the fuse receives power. The load detail data 650 can also include each terminal connected to a fuse along with a count and a description of each load. The load detail data 650 can also include the long-term current, the long-term voltage, the short-term current, the short-term voltage, the maximum current and the maximum voltage that each load can draw and/or receive. The load detail data 650 can also include the total fuse current values and fuse load percentages for long-term currents, short-term currents and/or maximum currents. The load detail data 650 can also include the drivability ranking.

Referring again to FIGS. 1A, 5A and 5B, the modeling processor 102 may receive a request to view alternative data at block 528. In response to receiving the request, the modeling processor 102 can cause the output device 108 to output the alternative data at block 530.

Returning reference to FIGS. 6A and 6B, one or more items or fields in the load summary data 600 and/or in the load detail data 650 may be selectable for navigating to various portions of the model 118. For example, a user may, using the input device 106, select an item on the load summary data 600, indicating a request to view information corresponding to the item. More specifically, a user may select a long-term, short-term or maximum current, voltage and/or fuse load percentage and, in response, the modeling processor 102 may cause the load detail data 650 to become displayed. In some embodiments, the modeling processor 102 may additionally or instead only show load data corresponding to the selected current, voltage or fuse load percentage, such as by displaying each load and the corresponding long-term, short-term and/or maximum current data.

A user may also select a field or other information within the load detail data 650 to navigate to various portions of the model 118. Referring to FIGS. 4 and 6B, a user may select the power line ACC to which the fuse 200 of FIG. 2 is connected. In response to this selection, the modeling processor 102 may cause the power source sub-model 126 to be output via the output device 108.

Referring now to FIGS. 2, 3 and 6B, a user can also select a terminal ID from the load detail data 650. In response, the modeling processor 102 may cause the sub-model diagram corresponding to the selected terminal to be output via the output device 108. For example, if the user selects the terminal 206, the modeling processor 102 may cause the first sub-model 120 to be displayed so that the user can review components and/or other information corresponding to the terminal 206. Likewise, the user can select the terminal 302 such that the modeling processor 102 may cause the output device 108 to output the second sub-model 122. The user may then return to the load detail data 650 by again selecting the fuse 200 to open the load summary data 600 of FIG. 6 and then selecting an option to return to the load detail data 650. Alternative methods may also exist for returning to the load detail data 650 and/or the load summary data 600 of FIG. 6.

The load detail data 650 also includes a first button 652 corresponding to the terminal 206 and a second button 654 corresponding to the terminal 302. A user may select the first button 652 or the second button 654 to go to the terminal 206 or the terminal 302, respectively.

In some embodiments, a user can select a load, a number corresponding to the load, a drivability ranking and/or a long-term, short-term and/or maximum voltage and/or current. In response to this selection, the modeling processor 102 can cause the output device 108 to output the sub-model corresponding to the selected load. In some embodiments, the modeling processor 102 may also cause the output device 108 to output information corresponding to the load. The information can include any technical or other information corresponding to the selected load such as, for example, a current, voltage and/or power rating of the load; dimensions of the load; an impedance, inductance and/or resistance of the load; materials used in construction of the load; and/or any additional information.

Figure 6C:
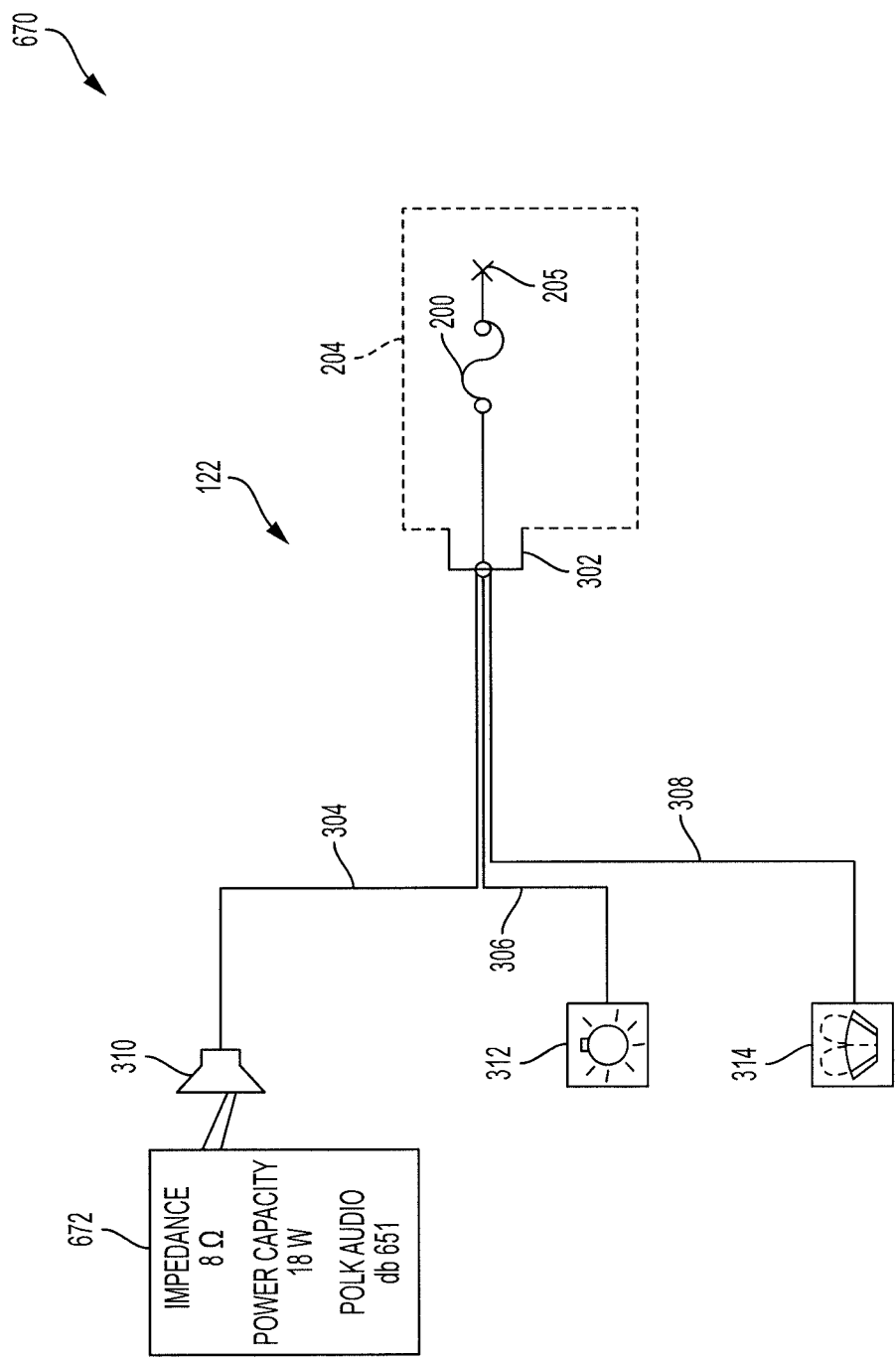
FIG. 6C is a drawing illustrating the sub-model of FIG. 3 including additional information corresponding to a load according to an aspect of the present invention.

For example and referring to FIGS. 6B and 6C, in response to a user selection of the speaker 310, the modeling processor 102 can display a new view 670 of the second sub-model 122. The new view 670 can include information 672 corresponding to the speaker 310. The information 672 can include an impedance of the speaker 310, the power capacity of the speaker 310 and a manufacturer and model of the speaker 310.

Returning briefly to FIGS. 1A, 5A and 5B, if a request has not been received to view alternative data at block 528, the modeling processor 102 may cause the output device 108 to continue outputting any data or view that is currently being displayed until the modeling processor 102 receives a request to change information or views in block 530.

Returning reference now to FIGS. 1A and 1B, the fuse load database 110 can be generated and/or updated in multiple manners. For example and in some embodiments, the modeling processor 102 can automatically generate and/or update the fuse load database 110 using information within the stored models and sub-models 114. For example, the modeling processor 102, by executing the second application 130, may generate and/or update the fuse load database 110.

Figure 7:
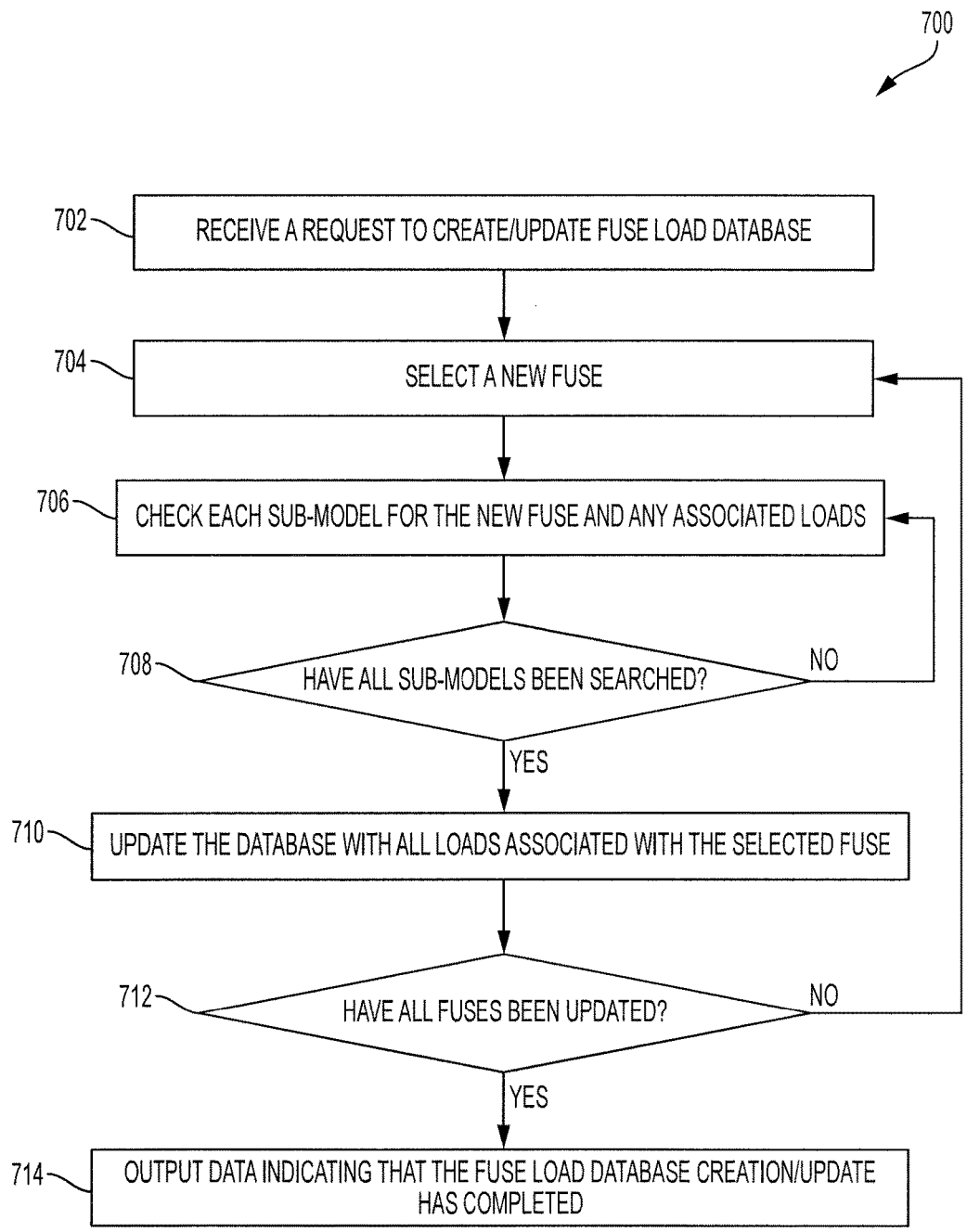
FIG. 7 is a flowchart illustrating a method for generating a fuse load database according to an aspect of the present invention.

Referring now to FIGS. 1A and 7, the modeling processor 102 can perform a method 700 for generating and/or updating the fuse load database 110. The method 700 or a similar method may be executed within the second application 130 and/or within the modeling program 112.

In block 702, the modeling processor 102 can receive a request to create and/or update the fuse load database 110. This request can be received, for example, from the input device 106. In some embodiments, a user can make the request within the model 118, within the second application 130 and/or within another application being executed by the modeling processor 102.

In block 704, the modeling processor 102 can select a new fuse to search for within the stored models and/or sub-models 114. The selection of the fuse may be based on the request received in block 702. If the selection is to update the fuse load database 110 after a change has been made to loads of some, but not all, fuses, the modeling processor 102 may select a fuse from the fuses that have updated load data. A new fuse from the fuses that have updated load data may be selected during each iteration of the method 700. If the request is to generate the fuse load database, the modeling processor 102 may select one of the fuses within the stored models/sub-models during each iteration of the method 700.

At block 706, the modeling processor 102 may search each sub-model for any information associated with the fuse that was selected in block 704. For example, the modeling processor 102 may iteratively open each sub-model and determine if the selected fuse is present. If the selected fuse is not present, the modeling processor 102 may proceed to the next sub-model. If the selected fuse is present, the modeling processor 102 may store any information associated with the selected fuse in a temporary file that may be within a cache of the modeling processor 102, within the memory 104 and/or within the fuse load database 110. For example, the modeling processor 102 may store each load and associated information within a temporary file until all sub-models of the model have been searched. The modeling processor 102 then may add the load data into the fuse load database 110. In some embodiments, the modeling processor 102 may update the fuse load database 110 based on the data in the temporary file and/or may update the fuse load database 110 as it determines fuse load data.

At block 708, the modeling processor 102 may determine whether all of the sub-models of the model 118 have been searched by the modeling processor 102. If all of the sub-models have not been searched, the method 700 may return to block 706. If all of the sub-models have been searched, the method 700 proceeds to block 710.

In block 710, the modeling processor 102 may update the fuse load database 110 with all of the loads that are associated with the selected fuse. In some embodiments, the modeling processor 102 may update the fuse load database 110 each time a load is found that corresponds to the selected fuse.

In block 712, the modeling processor 102 may determine whether all fuses have been added/updated. If all of the fuses have been added/updated, the method 700 may proceed to block 714 where the modeling processor 102 may output, using the output device 108, an indicator that the fuse load database 110 has been generated and/or updated. This indicator may indicate to the user that the fuse load database 110 can be accessed by an application, such as the first application 128 and/or the modeling program 112.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A system for determining whether total current that can flow through fuses is at or below a predetermined current limit that is based on a current rating of the fuses, the system comprising:
an output device configured to output data;
a memory configured to store:
a fuse load database including an identifier of each of the fuses, a list of loads that are each designed to be coupled to at least one fuse and current values each corresponding to a load from the list of loads, and
a digital model of a vehicle that includes multiple digital sub-models including the fuses, the loads, and connections between the fuses and the loads;
an input device configured to receive a selection of a fuse; and
a modeling processor coupled to the output device, the memory, and the input device and configured to:
generate or update the fuse load database by iteratively comparing the selected fuse to each of the multiple digital sub-models to determine which of the loads are designed to be coupled to the selected fuse based on the connections between the fuses and the loads,
determine one or more loads from the list of loads that are designed to be coupled to the selected fuse based on a comparison of the selected fuse to the fuse load database,
generate load summary data corresponding to a sum of the current values that correspond to the one or more loads, and
control the output device to output the load summary data such that a user can more efficiently determine load currents connected to the selected fuse.

2. The system of claim 1 wherein the output device includes a display coupled to the modeling processor and wherein the modeling processor is further configured to cause the display to display a sub-model diagram corresponding to one of the multiple digital sub-models and including the selected fuse and wherein the selected fuse is selected from the sub-model diagram.

3. The system of claim 1 wherein the load summary data includes a sum of long-term load current values that correspond to the one or more loads that are designed to be coupled to the selectable fuse and a sum of short-term load current values that correspond to the one or more loads that are designed to be coupled to the selectable fuse.

4. The system of claim 1 wherein the modeling processor is further configured to determine load detail data including a list of the one or more loads that are designed to be coupled to the selected fuse, a list of terminals each designed to be positioned between the selected fuse and at least one corresponding load from the list of one or more loads, a description of each of the one or more loads that are designed to be coupled to the selected fuse and a current value that is associated with each of the one or more loads that are designed to be coupled to the selected fuse.

5. The system of claim 4 wherein the output device includes a display coupled to the modeling processor and configured to display the load detail data and wherein the input device is further configured to receive a selection of a terminal from the list of terminals and the modeling processor is further configured to cause the display to display a sub-model diagram corresponding to one of the multiple digital sub-models and including the selected fuse, the selected terminal and the at least one load corresponding to the selected terminal.

6. The system of claim 4 wherein the output device includes a display coupled to the modeling processor and configured to display the load detail data and wherein:
the load detail data also includes a power line designed to be coupled between a power source and the selected fuse;
the input device is further configured to receive input corresponding to a selection of the power line; and
the modeling processor is further configured to cause the display to display a power sub-model corresponding to one of the multiple digital sub-models and including at least the power line and the power source.

7. The system of claim 1 wherein the modeling processor is further configured to control the output device to output a warning if the sum of the current values is greater than the predetermined current limit.

8. A method for determining whether total current that can flow through fuses is at or below a predetermined current limit that is based on a current rating of the fuses comprising:
storing, in a memory, a digital model of a vehicle that includes multiple digital sub-models including the fuses and loads connected to the fuses;
generating or updating, by a modeling processor, a fuse load database that includes an identifier of each of the fuses, a list of loads that are designed to be coupled to each of the fuses, and current values each corresponding to one of the loads, the fuse load database being generated or updated by iteratively comparing the identifier of each of the fuses to each of the multiple digital sub-models to identify the loads that are designed to be coupled to the fuses;

storing, in the memory, the fuse load database;

receiving, via an input device, a selection of a fuse;

determining, by a modeling processor, one or more loads from the list of loads that are designed to be coupled to the selected fuse by comparing the selected fuse to the fuse load database;

generating, by the modeling processor, load summary data corresponding to a sum of the current values that correspond to the one or more loads; and outputting, by an output device, the load summary data such that a user can more efficiently determine load currents connected to the selected fuse.

9. The method of claim 8 further comprising displaying, by a display, a sub-model diagram corresponding to one of the multiple digital sub-models and including the selected fuse and at least one of the one or more loads that are designed to be coupled to the selected fuse, wherein the selected fuse is selected from the sub-model diagram.

10. The method of claim 8 wherein the load summary data includes a sum of long-term load current values that correspond to the one or more loads that are designed to be coupled to the selected fuse and a sum of short-term load current values that correspond to the one or more loads that are designed to be coupled to the selected fuse.

11. The method of claim 8 further comprising determining, by the modeling processor, load detail data including a list of the one or more loads that are designed to be coupled to the selected fuse, a list of terminals each designed to be positioned between the selected fuse and at least one corresponding load from the list of one or more loads that are designed to be coupled to the selected fuse, a description of each of the one or more loads that are designed to be coupled to the selected fuse and a current value that is associated with each of the one or more loads that are designed to be coupled to the selected fuse.

12. The method of claim 11 further comprising:

displaying, by a display, the load detail data;

receiving, via the input device, a selection of a terminal from the list of terminals; and causing, by the modeling processor, the display to display a sub-model diagram corresponding to one of the multiple digital sub-models and including the selected fuse, the selected terminal, and the at least one load corresponding to the selected terminal.

13. The method of claim 11 further comprising:

displaying, by a display, the load detail data that further includes a power line designed to be coupled between a power source and the selected fuse;

receiving, via the input device, input corresponding to a selection of the power line; and causing, by the modeling processor, the display to display a power sub-model corresponding to one of the multiple digital sub-models and including at least the power line and the power source.

14. The method of claim 8 further comprising outputting, by the output device, a warning if the sum of the current values is greater than the predetermined current limit.

15. A method for determining whether total current that can flow through fuses is at or below a predetermined current limit that is based on a current rating of the fuses comprising:

storing, in a memory, a digital model of a vehicle that includes multiple digital sub-models including the fuses and loads that are designed to be connected to the fuses;

storing, in the memory, a fuse load database including an identifier of each of the fuses, a list of loads that are designed to be coupled to at least one fuse and current values each corresponding to a load from the list of loads;

displaying, by a display, a first sub-model diagram corresponding to one of the multiple digital sub-models and including a selectable fuse of the fuses and one or more loads from the list of loads that are designed to be coupled to the selectable fuse;

receiving, via an input device, input data corresponding to a selection of the selectable fuse;

generating, by the modeling processor, load summary data corresponding to a sum of the current values that correspond to the one or more loads that are designed to be coupled to the selectable fuse by comparing the selectable fuse to the fuse load database; and displaying, by the display, the load summary data such that a user can more efficiently determine load currents connected to the selectable fuse.

16. The method of claim 15 wherein the load summary data includes a sum of long-term load current values that correspond to the one or more loads that are designed to be coupled to the selectable fuse and a sum of short-term load current values that correspond to the one or more loads that are designed to be coupled to the selectable fuse.

17. The method of claim 15 further comprising determining, by the modeling processor, load detail data including a list of the one or more loads that are designed to be coupled to the selected fuse, a list of terminals each designed to be positioned between the selected fuse and at least one corresponding load from the list of one or more loads, a description of each of the one or more loads that are designed to be coupled to the selected fuse and a current value that is associated with each of the one or more loads that are designed to be coupled to the selected fuse.

18. The method of claim 17 further comprising:

displaying, by the display, the load detail data;

receiving, via the input device, a selection of a terminal from the list of terminals; and causing, by the modeling processor, the display to display a second sub-model diagram corresponding to another of the multiple digital sub-models and including the selected fuse, the selected terminal and the at least one load configured to be coupled to the selected terminal.

19. The method of claim 17 further comprising:

displaying, by the display, the load detail data that further includes a power line coupled between a power source and the selected fuse;

receiving, via the input device, input corresponding to a selection of the power line; and causing, by the modeling processor, the display to display a power sub-model corresponding to another of the multiple digital sub-models and including at least the power line and the power source.

20. The method of claim 15 further comprising outputting, by the display, a warning if the sum of the current values is greater than the predetermined current limit.

* * * * *